United States Patent
Yamazaki

(10) Patent No.: US 10,031,310 B2
(45) Date of Patent: Jul. 24, 2018

(54) OPTICAL DEVICE, TERMINATOR, WAVELENGTH-TUNABLE LASER DEVICE, AND METHOD FOR MANUFACTURING OPTICAL DEVICE

(71) Applicant: NEC Corporation, Tokyo (JP)

(72) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/506,553

(22) PCT Filed: Feb. 18, 2015

(86) PCT No.: PCT/JP2015/000740
§ 371 (c)(1),
(2) Date: Feb. 24, 2017

(87) PCT Pub. No.: WO2016/031096
PCT Pub. Date: Mar. 3, 2016

(65) Prior Publication Data
US 2017/0254976 A1    Sep. 7, 2017

(30) Foreign Application Priority Data
Aug. 27, 2014   (JP) .................. 2014-172733

(51) Int. Cl.
*G02B 6/24* (2006.01)
*G02B 6/44* (2006.01)
(Continued)

(52) U.S. Cl.
CPC ........... *G02B 6/4471* (2013.01); *G02B 6/243* (2013.01); *G02B 6/4206* (2013.01); *G02B 6/4289* (2013.01); *H01S 5/1028* (2013.01)

(58) Field of Classification Search
None
See application file for complete search history.

(56) References Cited

U.S. PATENT DOCUMENTS 7,065,284 B2 * 6/2006 Ao .................. G02B 6/266
385/140
7,773,642 B2   8/2010 Yamazaki
(Continued)

FOREIGN PATENT DOCUMENTS

EP    1 737 090 A1   12/2006
JP    2005-070469 A   3/2005
(Continued)

OTHER PUBLICATIONS

International Search Report corresponding to PCT/JP2015/000740, dated May 19, 2015 (5 pages).

*Primary Examiner* — Uyen Chau N Le
*Assistant Examiner* — Chad H Smith
(74) *Attorney, Agent, or Firm* — Wilmer Cutler Pickering Hale and Dorr LLP

(57) ABSTRACT

An optical device capable of suppressing a reflected light at an end of an optical waveguide regardless of the width of the optical waveguide is provided. An optical device includes an optical waveguide and a terminator. The optical waveguide is formed on a substrate. The terminator is formed on the substrate in such a way that the terminator is connected to one end of the optical waveguide, includes a curved optical waveguide having such a curvature that it causes a bending loss in an input light input from the optical waveguide, the input light decaying as it propagates through the curved optical waveguide.

6 Claims, 7 Drawing Sheets

(51) Int. Cl.
*G02B 6/42* (2006.01)
*H01S 5/10* (2006.01)

(56) References Cited

U.S. PATENT DOCUMENTS

| | | |
|---|---|---|
| 7,792,399 B2 | 9/2010 | Kato |
| 8,494,336 B2 | 7/2013 | Jenkins et al. |
| 8,542,957 B2 | 9/2013 | Yamashita et al. |
| 2006/0104592 A1 | 5/2006 | Jenkins et al. |
| 2008/0232409 A1 | 9/2008 | Yamazaki |
| 2009/0185776 A1 | 7/2009 | Kato |
| 2011/0268385 A1 | 11/2011 | Yamashita et al. |
| 2013/0081447 A1* | 4/2013 | Carter ................... G01N 9/00 73/30.01 |
| 2014/0133795 A1* | 5/2014 | Evans ................ G02B 6/12016 385/11 |

FOREIGN PATENT DOCUMENTS

| | | |
|---|---|---|
| JP | 2006-520489 A | 9/2006 |
| JP | 2008-020226 A | 1/2008 |
| JP | 2009-175176 A | 8/2009 |
| JP | 2011-232574 A | 11/2011 |
| JP | 2012-048036 A | 3/2012 |
| WO | WO-2005/096462 A1 | 10/2005 |

\* cited by examiner

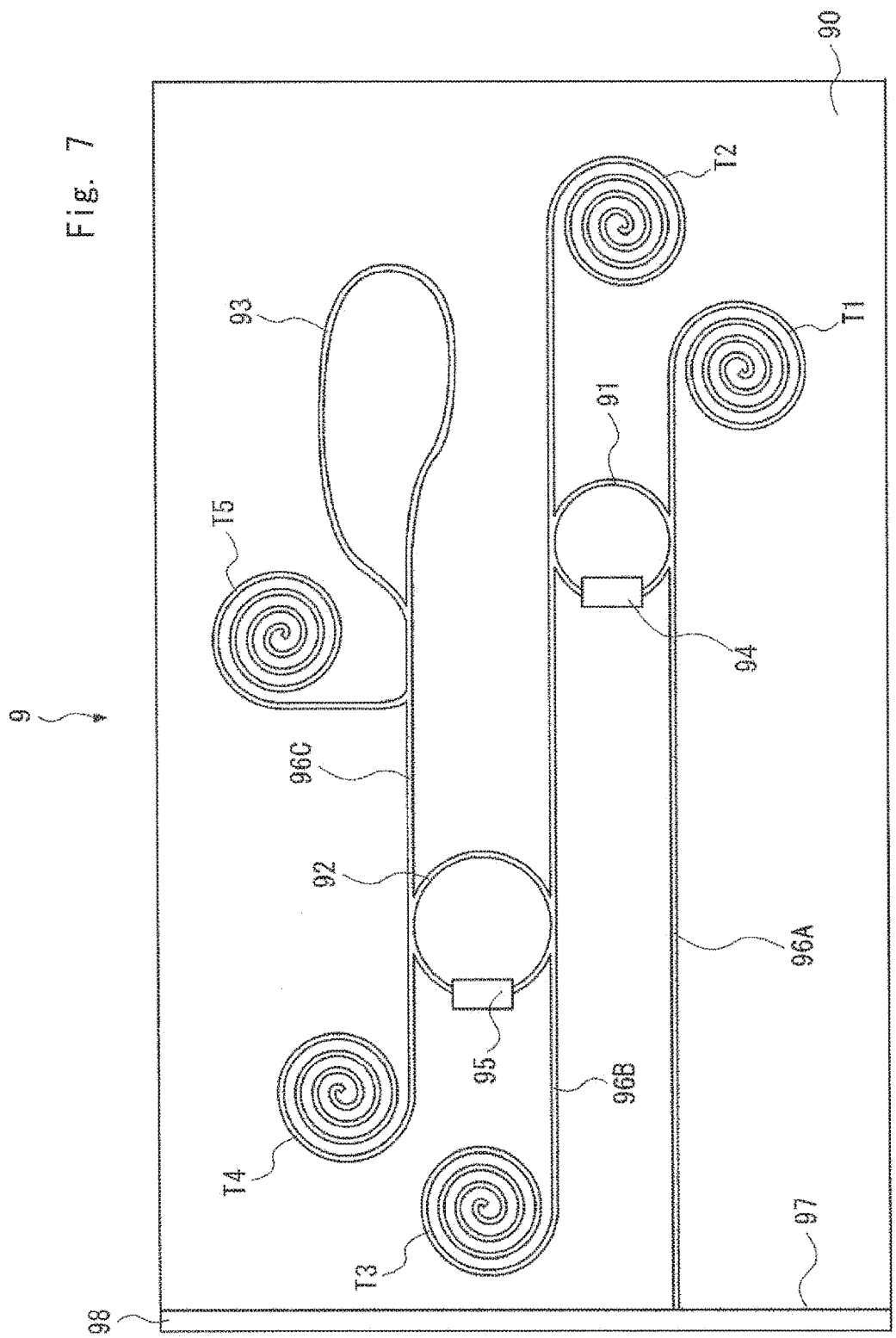

OPTICAL DEVICE, TERMINATOR, WAVELENGTH-TUNABLE LASER DEVICE, AND METHOD FOR MANUFACTURING OPTICAL DEVICE

TECHNICAL FIELD

The present invention relates to an optical device, a terminator, a wavelength-tunable laser device, and a method for manufacturing the optical device.

BACKGROUND ART

In an optical device, various structures for reducing light reflections at an end of an optical waveguide have been proposed. The low-reflection structures can be generally divided into two types.

One type is applied to a case in which an output end of the optical waveguide matches an end face of the optical device. In this case, the reflected light at the output end is reduced by applying a non-reflective coating to the end face. Another method for obtaining the low-reflection structure by adjusting the arrangement of the optical waveguide is also known. In this case, the reflected light at the end face can be reduced by arranging the optical waveguide obliquely with respect to the end face, not vertical to the end face.

The other one type is applied to a case in which the end of the optical waveguide is located inside the optical device. In this case, by tapering the end of the optical waveguide, the refractive index of a clad and the equivalent refractive index of the optical waveguide can be brought closer together. It is therefore possible to suppress Fresnel reflections at the end and to reduce the reflected light. This method is suitable for a waveguide such as a silica optical waveguide in which the refractive index difference between a core (an optical waveguide) and the clad is small.

Further, it has been proposed to provide a terminator to terminate the optical waveguide inside the optical device. A method of connecting, in an OTDR (Optical Time Domain Reflectometer) measurement, an optical fiber having a terminator to an end of an optical fiber to be measured and decreasing the changes in the intensities of a return light measured at the end of the optical fiber to be measured is, for example, proposed (Patent Literature 1). According to this method, it is possible to accurately detect breaking, bending or the like near the end of the optical fiber to be measured.

CITATION LIST

Patent Literature

PTL1: Japanese Unexamined Patent Application Publication No. 2008-20226

SUMMARY OF INVENTION

Technical Problem

However, the inventor has found a problem described below in the aforementioned method when this method is applied to a case in which the end of the optical waveguide is located inside the optical device. When the refractive index of the core greatly differs from the refractive index of the core like in the case of the silicon optical waveguide, for example, even when the end of the optical waveguide is tapered, it is difficult to sufficiently suppress the reflected light. In this case, Fresnel reflections can be sufficiently suppressed if the width of the optical waveguide can be gradually narrowed down to about several nm. However, due to the limitations of the microfabrication technology, it is too difficult to form the optical waveguide having a narrow width of about several nm and the width of the optical waveguide can only be narrowed down to about 100 nm for practical reasons. Therefore, a structure in which the silicon optical waveguide can be low-reflected regardless of the width of the silicon optical waveguide is required.

The present invention has been made in view of the above-mentioned circumstances, and an object of the present invention is to provide an optical device capable of suppressing the reflected light at the end of the optical waveguide regardless of the width of the optical waveguide.

Solution to Problem

An optical device according to one aspect of the present invention includes: an optical waveguide through which light propagates, the optical waveguide being formed on a substrate; and a terminator formed on the substrate in such a way that the terminator is connected to one end of the optical waveguide and including a curved optical waveguide having such a curvature that it causes a bending loss in an input light input from the optical waveguide, the input light decaying as it propagates through the curved optical waveguide.

A terminator according to one aspect of the present invention is formed in such a way that the terminator is connected to one end of an optical waveguide and includes a curved optical waveguide having such a curvature that it causes a bending loss in an input light input from the optical waveguide, the input light decaying as it propagates through the curved optical waveguide.

A wavelength-tunable laser device according to one aspect of the present invention includes: a laser oscillator having an end face from which a laser light is output; and a wavelength adjustment unit adjusting a wavelength of the laser light, in which: the wavelength adjustment unit includes: a mirror that constitutes a laser resonator between the end face of the laser oscillator and the mirror; a ring resonator provided in the laser resonator and having a variable effective refractive index with respect to the laser light; a first optical waveguide that couples together the end face, the mirror, and the ring resonator of the wavelength adjustment unit; and a terminator formed in such a way that the terminator is connected to an open end of the first optical waveguide and including a curved optical waveguide having such a curvature that it causes a bending loss in an input light input from the first optical waveguide, the input light decaying as it propagates through the curved optical waveguide, and the curvature of the curved optical waveguide is smaller than the curvature of the optical waveguide that constitutes the ring resonator.

A method for manufacturing an optical device according to one aspect of the present invention includes: forming an optical waveguide through which light propagates on a substrate; and forming a terminator on the substrate in such a way that the terminator is connected to one end of the optical waveguide, the terminator including a curved optical waveguide having such a curvature that it causes a bending loss in an input light input from the optical waveguide, the input light decaying as it propagates through the curved optical waveguide.

Advantageous Effects of Invention

According to the present invention, it is possible to provide the optical device capable of suppressing the

BRIEF DESCRIPTION OF DRAWINGS

FIG. 7 is a top view schematically showing a configuration of a photonics device according to the sixth embodiment.

DESCRIPTION OF EMBODIMENTS

Figure 1:
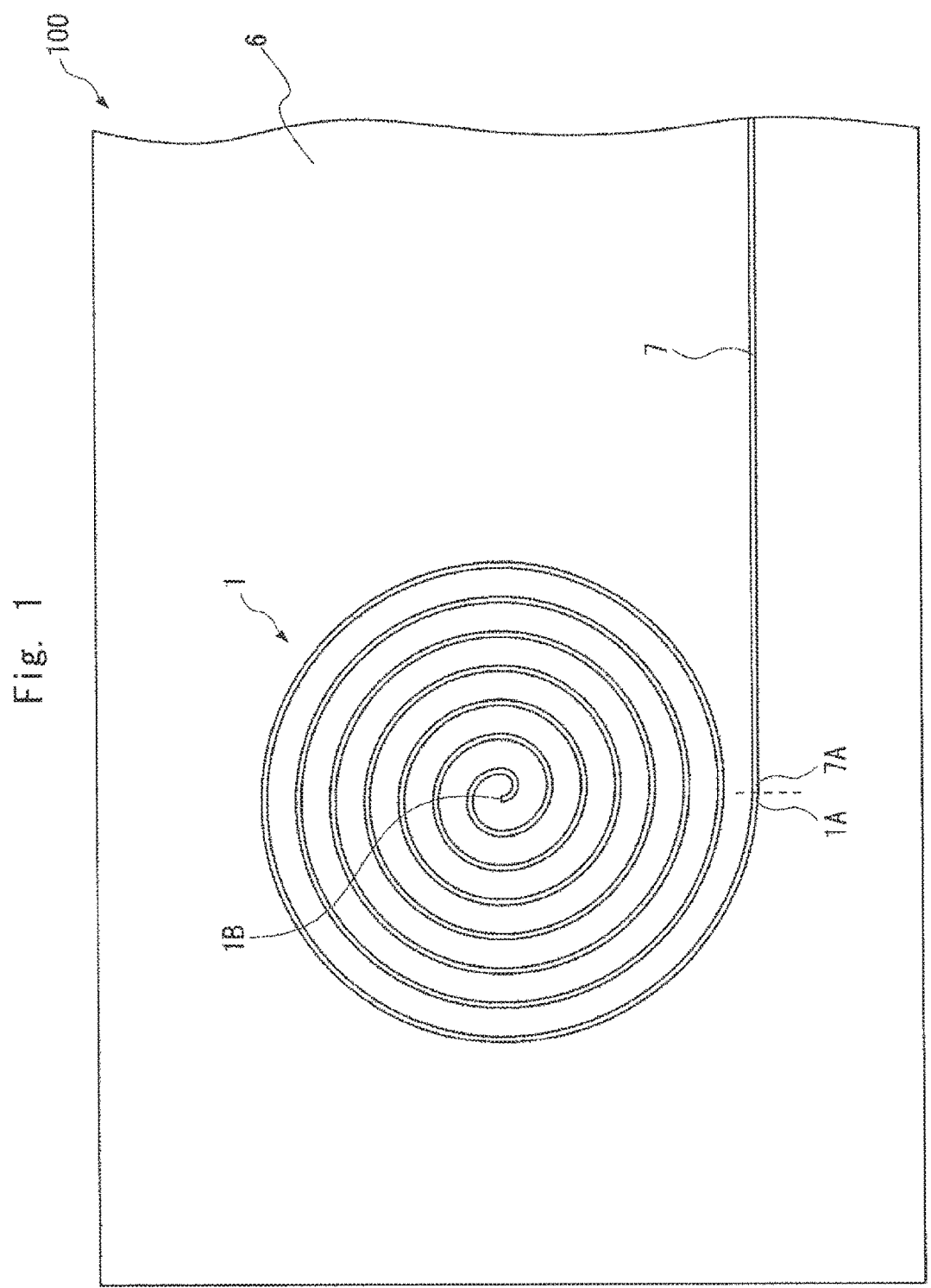
FIG. 1 is a top view of the main part of an optical device according to a first embodiment.

Exemplary embodiments of the present invention will be described below with reference to the drawings. The same components are denoted by the same reference numerals throughout the drawings, and a repeated explanation is omitted as needed.

An optical device having a low-reflection structure according to the following embodiments includes an optical waveguide through which light propagates and a terminator connected to this optical waveguide and terminating the light that is made incident from the optical waveguide. The terminator according to the following embodiments is configured to include one or a plurality of curved optical waveguides. The curved optical waveguide of the terminator is formed to have such a curvature that it causes a bending loss in the propagating light. Therefore, the light that has been made incident on the terminator from the optical waveguide is externally scattered after it experiences the bending loss when it passes through the curved optical waveguide of the terminator and thus the light intensity is reduced. Thus, the light intensity becomes weaker as the light proceeds through the curved optical waveguide of the terminator, whereby the input light can be terminated.

First Embodiment

An optical device 100 having a low-reflection structure according to a first embodiment will be described. FIG. 1 is a top view of the main part of the optical device 100 according to the first embodiment. The optical device 100 includes an optical waveguide 7 made of silicon formed on a substrate 6. A terminator 1 is connected to an end 7A of the optical waveguide 7.

FIG. 1 shows an example in which the terminator 1 is formed of a spiral optical waveguide, which is a curved optical waveguide having a spiral shape with a center axis in a direction vertical to the waveguide direction of the optical waveguide 7 and a direction vertical to the principal surface of the substrate 6 (that is, the direction vertical to the sheet of FIG. 1). The spiral optical waveguide is made of, for example, silicon. An outer end 1A of the terminator 1 is connected to the end 7A of the optical waveguide 7 with a small curvature in order to minimize the bending loss in the light input from the optical waveguide 7. After that, the curvature of the terminator 1 gradually increases as the light that has been input from the optical waveguide 7 propagates toward an inner end 1B of the terminator 1. Accordingly, as the light that has been input from the optical waveguide 7 propagates through the terminator 1, the bending loss of the light becomes gradually large and the light decays.

Note that the optical waveguide 7 and the terminator 1 may be buried by a clad having a refractive index smaller than those of the optical waveguide 7 and the terminator 1. In FIG. 1, the clad is not shown for the sake of simplification of the drawing.

According to the aforementioned configuration, it is possible to provide a low-reflective optical waveguide terminator also in a silicon optical waveguide having a high refractive index difference by a simple layout in which the terminator is formed of the curved optical waveguide. Further, since the light that has reached the end of the optical waveguide 7 is terminated after it enters the terminator 1, the width of the optical waveguide 7 does not involve the termination of the light. Therefore, according to this configuration, it is possible to provide an optical device capable of suppressing the reflected light at the end of the optical waveguide regardless of the width of the optical waveguide.

In this configuration, the light leaked out from the terminator 1 is equally scattered in all directions. Therefore, in the optical device 100, the intensity of the scattered light is not increased in a specific direction, and the influences of the scattered light on other devices mounted on the optical device 100 can be suppressed.

According to this configuration, the terminator 1 is a spiral optical waveguide whose curvature becomes gradually large. Therefore, the curvature of the spiral optical waveguide becomes small near the outer end 1A. Accordingly, the optical waveguide 7 and the terminator 1 are smoothly connected to each other. It is therefore possible to suppress the back scattering when the light is made incident on the terminator 1 from the optical waveguide 7, to thereby reduce the light returned into the optical waveguide 7.

Furthermore, since it is sufficient to constitute the terminator by the curved optical waveguide that can be manufactured in the same manner as the normal optical waveguides, there is no need to use a special process and so on. It is therefore possible to obtain a desired anti-reflection structure without increasing the manufacturing cost. Accordingly, it is possible to significantly improve the characteristics of the optical device such as a wavelength-tunable laser which requires termination at a low reflectivity.

Second Embodiment

Figure 2:
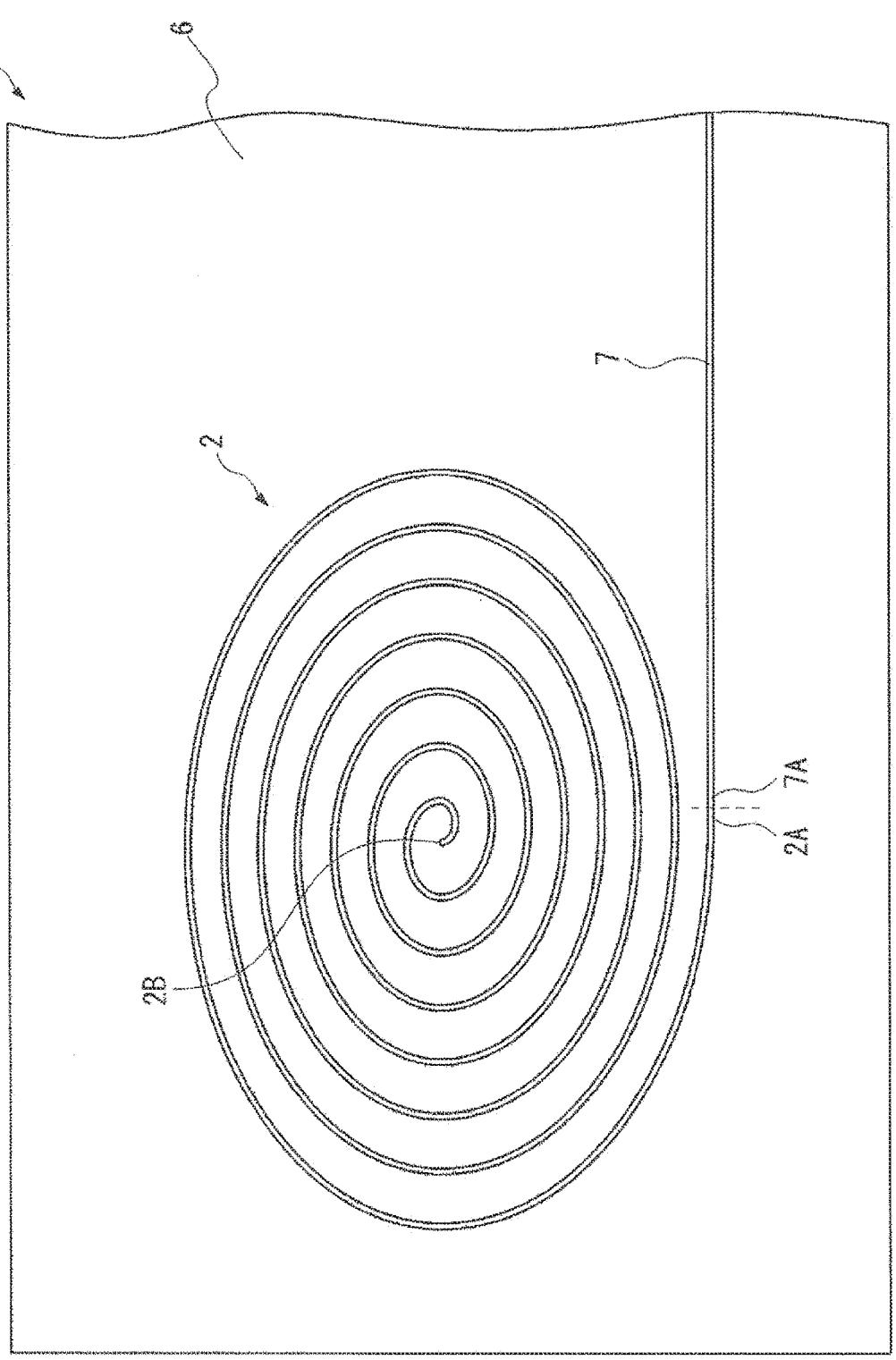
FIG. 2 is a top view of the main part of an optical device according to a second embodiment.

An optical device 200 having a low-reflection structure according to a second embodiment will be described. FIG. 2 is a top view of the main part of the optical device 200 according to the second embodiment. The optical device 200 includes a terminator 2 in place of the terminator 1 provided in the optical device 100.

This embodiment shows an example in which the terminator 2 is formed of an elliptical spiral optical waveguide, which is a curved optical waveguide having an elliptical shape with a center axis in the direction vertical to the waveguide direction of the optical waveguide 7 and the direction vertical to the principal surface of the substrate 6 (that is, the direction vertical to the sheet of FIG. 2) and a long diameter along the waveguide direction of the optical waveguide 7. In the terminator 2, similar to the terminator 1, an outer end 2A is connected to the end 7A of the optical waveguide 7 with a small curvature in order to minimize the bending loss in the light input from the optical waveguide 7. After that, the curvature of the terminator 2 gradually increases as the light that has been input from the optical waveguide 7 propagates toward an inner end 2B of the terminator 2. Accordingly, as the light that has been input from the optical waveguide 7 propagates through the terminator 2, the bending loss of the light becomes gradually large and the light decays.

Further, the curvature of the terminator 2 becomes large and the bending loss becomes large in the vicinity of the area where the terminator 2 intersects with the long diameter. Around this area, the tangential direction of the terminator 2 becomes substantially perpendicular to the waveguide direction of the optical waveguide 7. That is, the terminator 2 has an elliptical shape with a long diameter along the waveguide direction of the optical waveguide 7, to thereby enable suppression of the light from the terminator 2 that is leaked out to the waveguide direction of the optical waveguide 7.

The direction of the long diameter of the terminator 2 is merely one example and it may be any desired direction. That is, by forming the terminator 2 of the elliptical spiral optical waveguide, the light that leaks out to the long-diameter direction of the elliptical spiral optical waveguide can be suppressed.

According to the aforementioned configuration, similar to the first embodiment, it is possible to provide an optical device capable of suppressing the reflected light at the end of the optical waveguide regardless of the width of the optical waveguide. Further, in this configuration, similar to the first embodiment, the curvature of the elliptical spiral optical waveguide becomes small near the outer end 2A. Therefore, the optical waveguide 7 and the terminator 2 are smoothly connected to each other. It is therefore possible to suppress the back scattering when the light is made incident on the terminator 2 from the optical waveguide 7, to thereby enable the reduction of the light returned into the optical waveguide 7.

Further, as described above, the terminator 2 is able to make the intensity of the light that is leaked out uneven. Accordingly, when devices such as light-receiving devices in which it is desired to prevent light other than a desired light from entering are integrated, for example, inside the optical device 200, these devices may be arranged in a direction in which it is possible to suppress the leaked light of the terminator 2 so that it is possible to prevent the entrance of the leaked light from the terminator 2.

Third Embodiment

Figure 3:
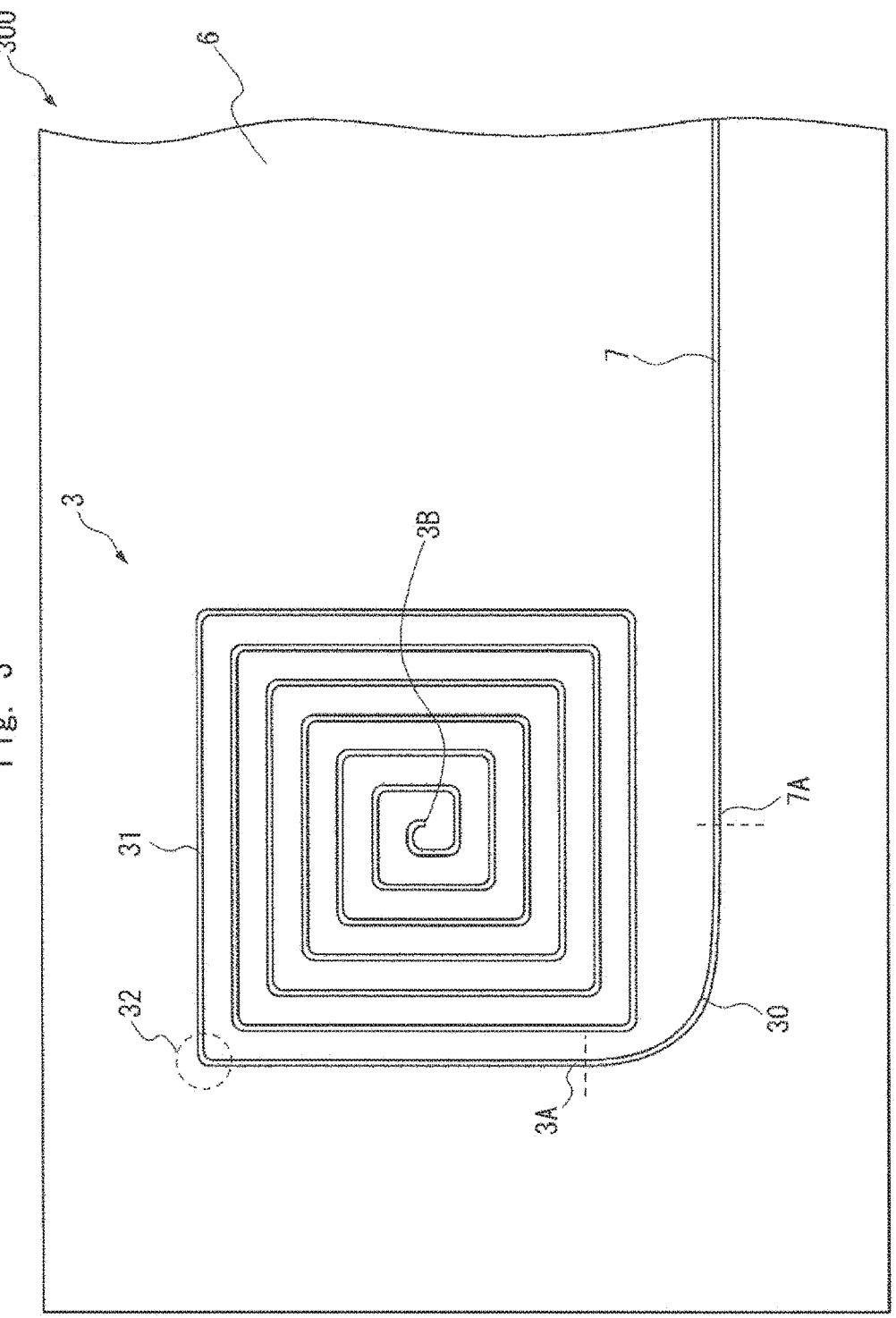
FIG. 3 is a top view of the main part of an optical device according to a third embodiment.

An optical device 300 having a low-reflection structure according to a third embodiment will be described. FIG. 3 is a top view of the main part of the optical device 300 according to the third embodiment. The optical device 300 includes a terminator 3 in place of the terminator 1 provided in the optical device 100 and further includes an introducing optical waveguide 30.

In this embodiment, the terminator 3 is formed of a quadrangular spiral optical waveguide having a center axis in the direction vertical to the waveguide direction of the optical waveguide 7 and the direction vertical to the principal surface of the substrate 6 (that is, the direction vertical to the sheet of FIG. 3). An outer end 3A of the terminator 3 and the end 7A of the optical waveguide 7 are connected to each other by the introducing optical waveguide 30. The connection part between the introducing optical waveguide 30 and the end 7A of the optical waveguide 7 is formed to have a small curvature, more preferably, to have a curvature smaller than that of a bending part of the terminator 3 in order to prevent back scattering that will be described later. Further, the introducing optical waveguide 30 as a whole preferably has a curvature smaller than that of the bending part of the terminator 3.

The quadrangular spiral optical waveguide of the terminator 3 includes a straight part 31 and a bending part 32, which is a curved optical waveguide, alternately provided in the direction of the inner end 3B. The light input to the terminator 3 is gradually decays since bending loss occurs every time it passes through the bending part 32. The terminator 3 is thus able, like the terminator 1, to terminate the input light.

While the quadrangular spiral shape has been described in this embodiment, the shape of the quadrangle may either be square or rectangle. Further, the angles of the quadrangle may not be right angles. Further, the shape is not limited to the quadrangle and may be a triangle or a desired polygonal shape having five or more angles.

According to the aforementioned configuration, similar to the first embodiment, it is possible to provide the optical device capable of suppressing the reflected light at the end of the optical waveguide regardless of the width of the optical waveguide. Further, in this configuration, the end 7A of the optical waveguide 7 and the outer end 3A of the terminator 3 are connected to each other by the introducing optical waveguide 30 having a small curvature at a low loss. It is therefore possible to suppress the back scattering when the light is made incident on the terminator 3 from the optical waveguide 7, to thereby reduce the light returned into the optical waveguide 7.

Fourth Embodiment

Figure 4:
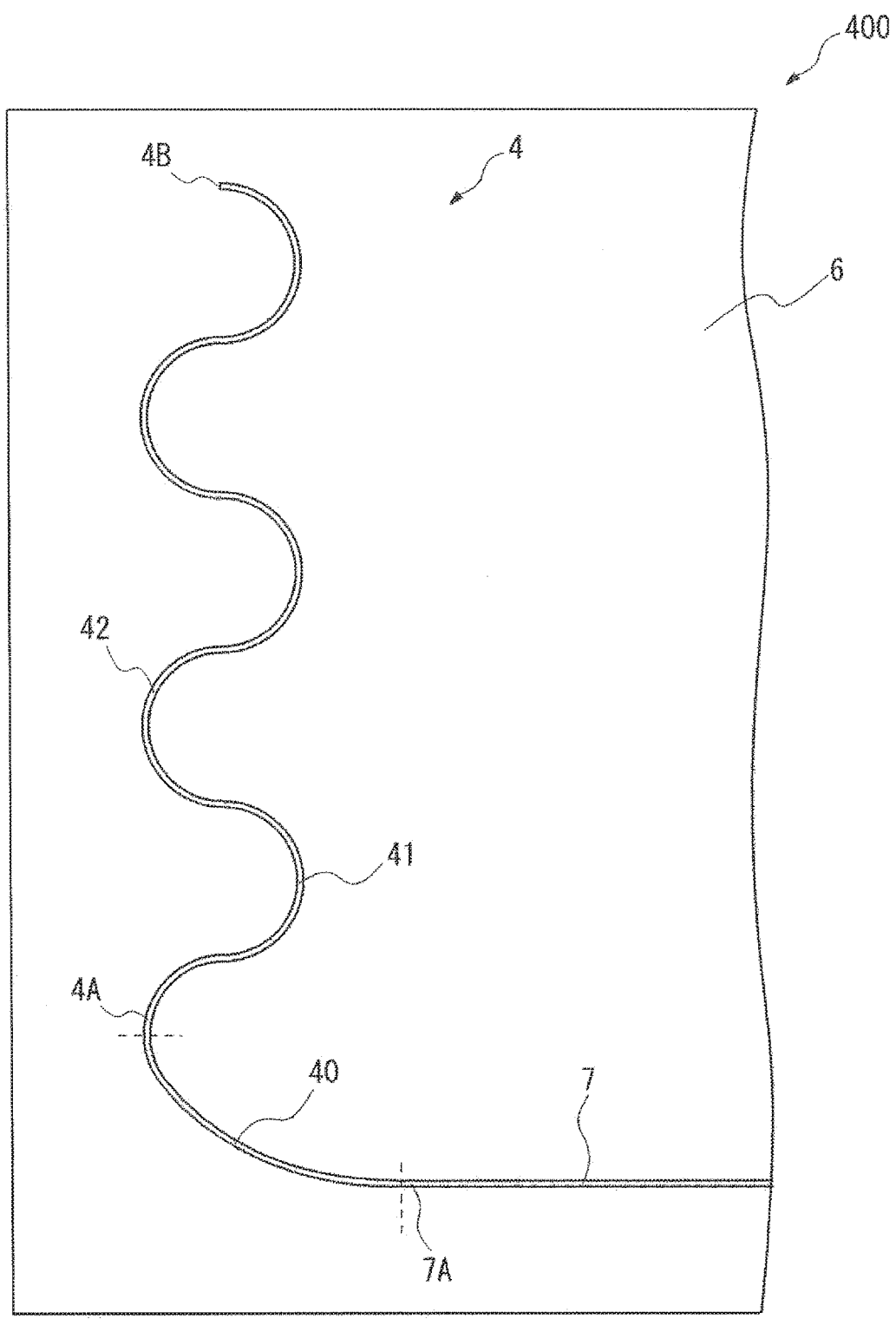
FIG. 4 is a top view of the main part of an optical device according to a fourth embodiment.

An optical device 400 having a low-reflection structure according to a fourth embodiment will be described. FIG. 4 is a top view of the main part of the optical device 400 according to the fourth embodiment. The optical device 400 includes a terminator 4 in place of the terminator 1 provided in the optical device 100 and further includes an introducing optical waveguide 40.

An outer end 4A of the terminator 4 and the end 7A of the optical waveguide 7 are connected to each other via the introducing optical waveguide 40, which is a curved optical waveguide. The connection part between the introducing optical waveguide 40 and the end 7A of the optical waveguide 7 is formed to have a small curvature, more preferably, to have a curvature smaller than that of a curved part of the terminator 4 in order to prevent back scattering that will be described later. Further, the introducing optical waveguide 40 as a whole preferably has a curvature smaller than that of the curved part of the terminator 4.

The terminator 4 includes a curved part 41 and a curved part 42 that are alternately repeated. The curved part 41, which is a curved optical waveguide, has a center axis in the direction vertical to the waveguide direction of the optical waveguide 7 and the direction vertical to the principal surface of the substrate 6 (that is, the direction vertical to the sheet of FIG. 4) and bends the path of the input light in the counterclockwise direction. The curved part 42, which is a curved optical waveguide, has a center axis in the direction vertical to the waveguide direction of the optical waveguide 7 and the direction vertical to the principal surface of the substrate 6 (that is, the direction vertical to the sheet of FIG. 4) and bends the path of the input light in the clockwise direction.

The light that has been input to the terminator 4 is gradually decayed as it propagates toward an inner end 4B since bending loss occurs every time it passes through the curved part 41 and the curved part 42. The terminator 4 is thus able, like the terminator 1, to terminate the input light.

While the curved part 41 and the curved part 42 are optical waveguides having a semi-circular arc shape in FIG. 4, the curved part 41 and the curved part 42 may be optical waveguides having a major arc shape or a minor arc shape. Further, the curved part 41 and the curved part 42 are not necessarily repeated alternately and there may be a part where the curved part 41 or the curved part 42 becomes continuous. Further, the curved parts do not necessarily have the same curvature and may have different curvatures.

According to the aforementioned configuration, similar to the first embodiment, it is possible to provide an optical device capable of suppressing the reflected light at the end of the optical waveguide regardless of the width of the optical waveguide. Further, in this configuration, the end 7A of the optical waveguide 7 and the terminator 4 are connected to each other by the introducing optical waveguide 40 at a low loss. As a result, it is possible to suppress back scattering when the light is made incident on the terminator 4 from the optical waveguide 7 and to thus reduce the light returned into the optical waveguide 7.

Fifth Embodiment

Figure 5:
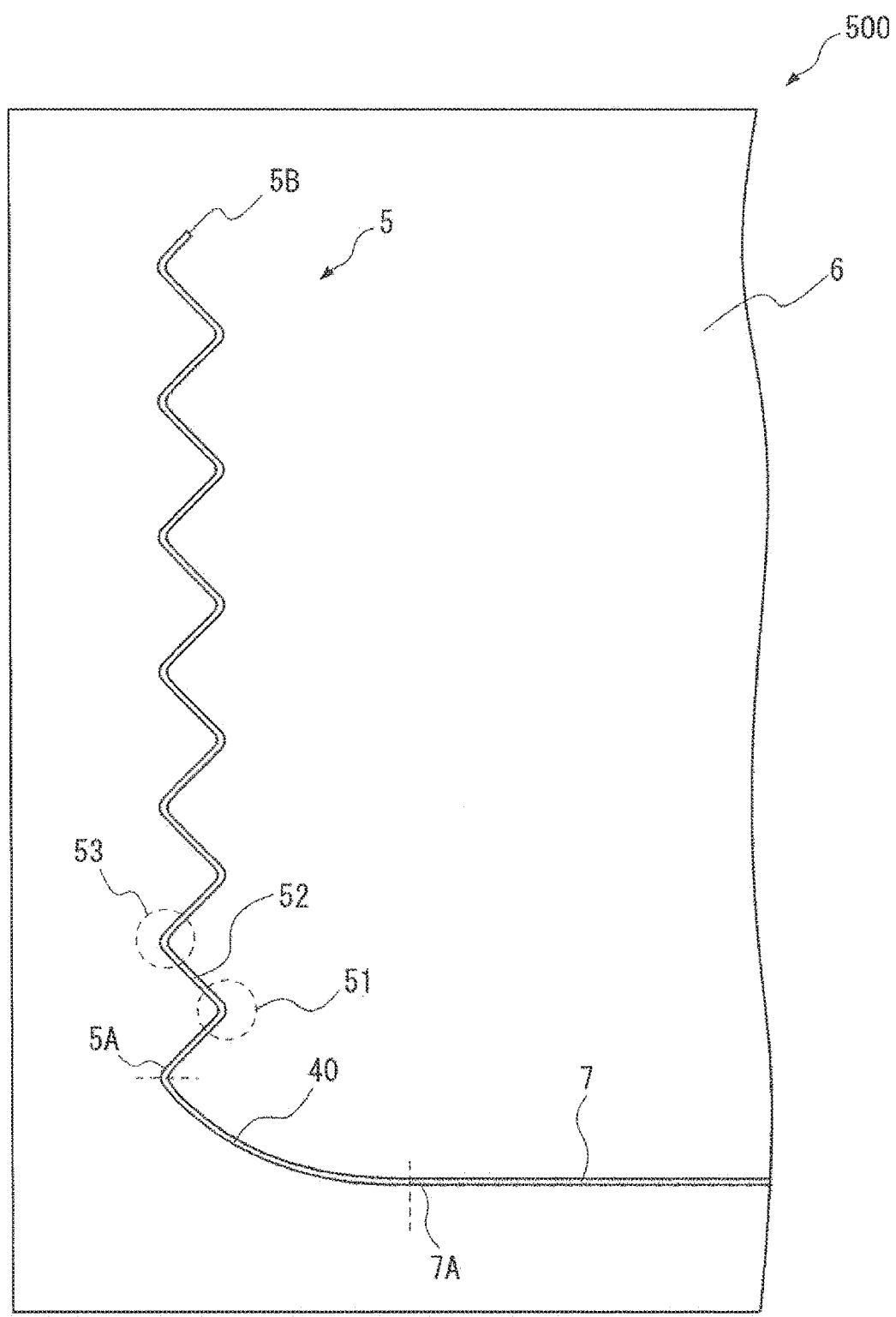
FIG. 5 is a top view of the main part of an optical device according to a fifth embodiment.

An optical device 500 having a low-reflection structure according to a fifth embodiment will be described. FIG. 5 is a top view of the main part of the optical device 500 according to the fifth embodiment. The optical device 500 includes a terminator 5 in place of the terminator 4 provided in the optical device 400.

The terminator 5 includes a bending part 51, a straight part 52, and a bending part 53. The bending part 51, which is a curved optical waveguide, has a center axis in the direction vertical to the waveguide direction of the optical waveguide 7 and the direction vertical to the principal surface of the substrate 6 (that is, the direction vertical to the sheet of FIG. 5) and bends the path of the input light in the counterclockwise direction. The bending part 53, which is a curved optical waveguide, has a center axis in the direction vertical to the waveguide direction of the optical waveguide 7 and the direction vertical to the principal surface of the substrate 6 (that is, the direction vertical to the sheet of FIG. 5) and bends the path of the input light in the clockwise direction. The bending part 51 and the bending part 53 are provided in such a way that they are alternately repeated with the straight part 52 provided therebetween.

An outer end 5A of the terminator 5 and the end 7A of the optical waveguide 7 are connected to each other by the introducing optical waveguide 40. The connection part between the introducing optical waveguide 40 and the end 7A of the optical waveguide 7 is formed to have a small curvature, more preferably, to have a curvature smaller than that of the bending part of the terminator 5 in order to prevent back scattering that will be described later. Further, the introducing optical waveguide 40 as a whole preferably has a curvature smaller than that of the bending part of the terminator 5.

The light input to the terminator 5 gradually decays as it propagates toward an inner end 5B thereof since bending loss occurs every time it passes through the bending part 51 and the bending part 53. Thus, the terminator 5 is able, like the terminator 1, to terminate the input light.

The bending part 51, the straight part 52, and the bending part 53 are not necessarily repeated in this order. There may be, for example, a part where each of the bending part 51, the straight part 52, and the bending part 53 becomes continuous. There may be a part where the bending part 51 and the bending part 53 are continuous. Further, the bending parts do not necessarily have the same curvature and some bending parts may have different curvatures. The bending parts do not necessarily have the same bending angle and some bending parts may have bending angles.

According to the aforementioned configuration, similar to the fourth embodiment, it is possible to provide an optical device capable of suppressing the reflected light at the end of the optical waveguide regardless of the width of the optical waveguide.

Sixth Embodiment

Figure 6:
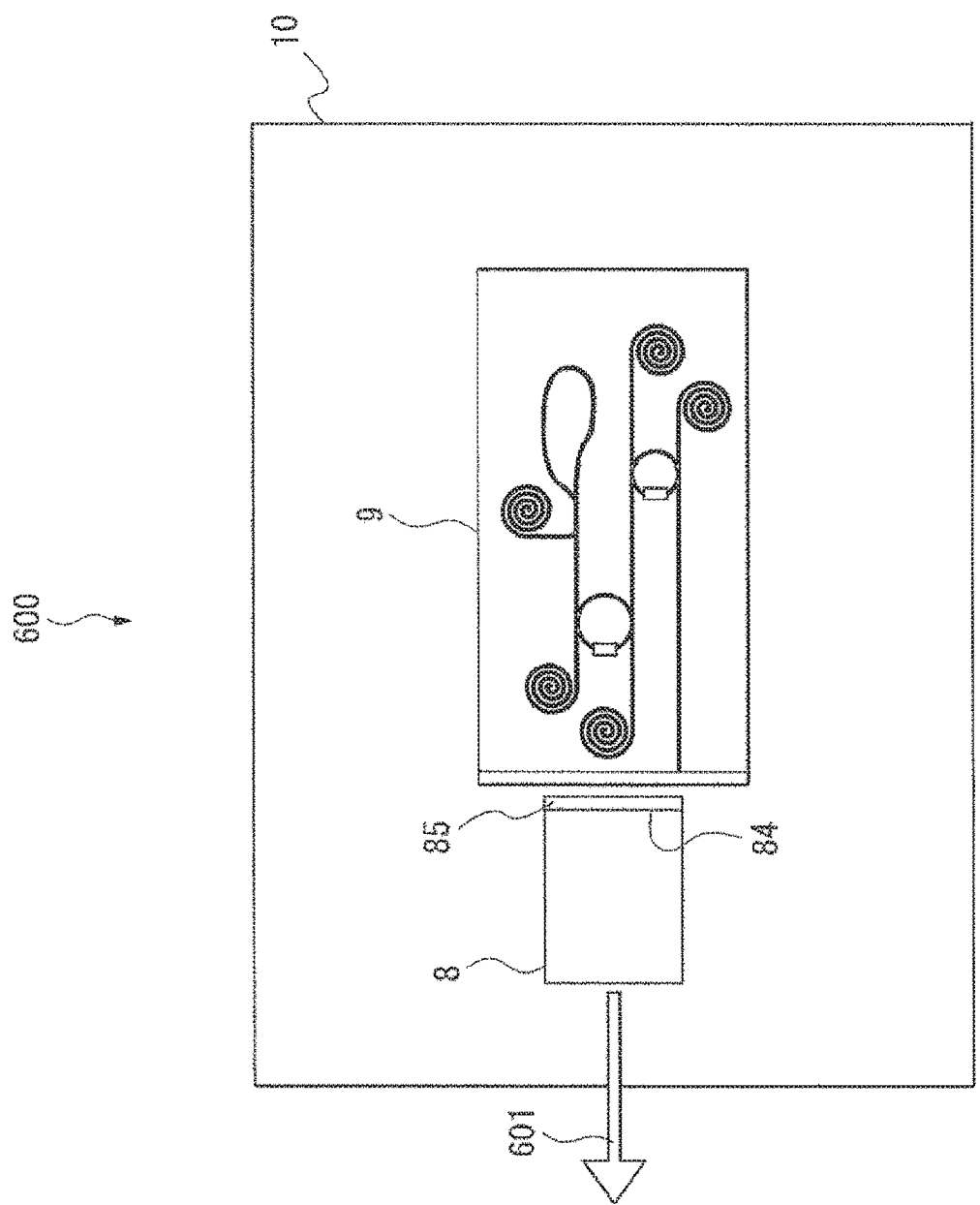
FIG. 6 is a top view schematically showing a configuration of an optical functional integrated unit according to a sixth embodiment.

An optical functional integrated unit 600 according to a sixth embodiment will be described. FIG. 6 is a top view schematically showing a configuration of the optical functional integrated unit 600 according to the sixth embodiment. In this embodiment, an example in which the optical functional integrated unit 600 is formed as a wavelength-tunable laser will be described. The optical functional integrated unit 600 includes a semiconductor optical amplifier 8, a photonics device 9, and a mounting board 10.

The semiconductor optical amplifier 8 and the photonics device 9 are mounted on the mounting board 10 under a condition that optical waveguides thereof are aligned with each other. In this case, the semiconductor optical amplifier 8 and the photonics device 9 are mounted with a gap of sub-micron (equal to or less than 1 μm). Note that, for simplifying the drawing, a visible gap is inserted between the semiconductor optical amplifier 8 and the photonics device 9 in FIG. 6. The same shall apply to the following drawings.

The semiconductor optical amplifier 8 is an example of a positive optical device outputting light, e.g., a semiconductor laser diode. The semiconductor optical amplifier 8 includes an active layer formed on a semiconductor substrate and the active layer is buried by a cladding layer. A non-reflective coating 85 is formed at an end on a side of an end face 84 of the active layer. The non-reflective coating 85 is formed as a non-reflective coating with respect to air or refractive index matching gel. While other elements such as a contact layer, an electrode and so on are formed on the cladding layer, they are not described in the present embodiment.

FIG. 7 is a top view schematically showing a configuration of the photonics device 9. The photonics device 9 is an example of a negative optical device that is configured by using Silicon (Si) and is an external resonator including a wavelength-tuning function in the present embodiment. The photonics device 9 can be produced by a Si-Process, e.g., a CMOS (Complementary Metal Oxide Semiconductor)-process, etc.

The photonics device 9 includes two ring resonators 91 and 92, a loop mirror 93, electrodes 94 and 95, silicon waveguides 96A to 96C, a non-reflective coating 98, and terminators T1 to T5, which are formed on a substrate 90. Note that the ring resonators 91 and 92 are also referred to as first and second ring resonators, respectively. The non-reflective coating 98 is also referred to as a second non-reflective film. The electrodes 94 and 95 are also referred to as first and second electrodes, respectively. The substrate 90 is configured, for example, as a silicon substrate or an SOI (Silicon on Insulator) substrate.

The silicon waveguides 96A to 96C are configured by a narrow line waveguide or a rib waveguide. The silicon waveguide 96A optically connects an end face 97 with the ring resonator 91. The silicon waveguide 96B optically connects the ring resonator 91 with the ring resonator 92. The silicon waveguide 96C optically connects the ring resonator 92 with the loop mirror 93. The non-reflective coating 98 is formed at an end on a side of the end face 97 of the silicon waveguide 96A. The non-reflective coating 98 is formed as a non-reflective coating with respect to air.

The electrode 94 is formed on a part of the ring resonator 91. The electrode 95 is formed on a part of the ring resonator 92. Further, the ring resonator 91 and the ring resonator 92 are slightly different in those diameters.

The terminators T1 to T5 are terminators formed of circular and concentric spiral optical waveguides, similar to the terminator 1 according to the first embodiment. The terminator T1 is connected to an open end of the silicon waveguide 96A. The terminator T2 is connected to an open end of the silicon waveguide 96B on a side close to the ring resonator 91. The terminator T3 is connected to an open end of the silicon waveguide 96B on a side close to the ring resonator 92. The terminator T4 is connected to an open end of the silicon waveguide 96C on a side close to the ring resonator 92. The terminator T5 is connected to an open end of the silicon waveguide 96C on a side close to the loop mirror 93. As described above, the open ends of the silicon waveguides 96A to 96C are terminated by the connection of any one of the terminators T1 to T5.

The ring resonators 91 and 92, the loop mirror 93, and the silicon waveguides 96A to 96C are buried by a cladding layer. Note that the cladding layer is omitted to explain the structure of the photonics device 9 in FIG. 7.

A light output from the side of the end face 84 of the active layer of the semiconductor optical amplifier 8 passes through the non-reflective coating 98 and is incident on the silicon waveguide 96A. The incident light is reflexed by the loop mirror 93 via the ring resonator 91, the silicon waveguide 96B, the ring resonator 92, and the silicon waveguide 96C. As described above, the ring resonator 91 and the ring resonator 92 are slightly different in those diameters. Therefore, the wavelength in which a peak of the ring resonator 91 and a peak of the ring resonator 92 harmonize is only one in the wide tunable range. Thus, resonance occurs at the wavelength selected by the ring resonator between the loop mirror 93 and the end face 84 of the semiconductor optical amplifier 8, and the optical functional integrated unit 600 performs laser oscillation. The laser light is output as a laser light 601.

The optical distance of the ring resonator 91 can be changed by applying a voltage to the electrode 94 to change the effective refractive index of the ring resonator 91. The optical distance of the ring resonator 92 can be changed by applying a voltage to the electrode 95 to change the effective refractive index of the ring resonator 92. Therefore, the oscillation wavelength of the optical functional integrated unit 600 can be changed by applying the voltages to the electrodes 94 and 95. That is, the optical functional integrated unit 600 can function as the wavelength-tunable laser.

Further, the open ends of the silicon waveguides 96A to 96C are terminated by the connection of one of the terminators T1 to T5. Therefore, the light emitted from the open end of the silicon waveguide does not return after the reflection in the silicon waveguide and decays after it is scattered due to the bending loss in the terminators T1 to T5. It is therefore possible to achieve a reflectionless termination and to improve the wavelength accuracy of the wavelength-tunable laser.

Other Embodiments

The present invention is not limited to the above-described exemplary embodiments, and can be modified as appropriate without departing from the scope of the invention. For example, the case in which silicon is used as the material of the optical waveguide has been described above. It is needless to say, however, that this is merely an example and another semiconductor material or $SiO_2$ through which light can propagate may be, for example, used to obtain a terminator and an optical device having similar function.

While the terminator 1 according to the first embodiment has been used as the terminals T1 to T5 in the sixth embodiment, this is merely one example. One of the terminators 2 to 5 may be used as the terminators T1 to T5. Further, the terminators T1 to T5 may not be the same terminator and the terminators 1 to 5 may be combined with each other.

The direction of the vortex and the number of turns of the spiral optical waveguides in the aforementioned embodiments are merely an example and the direction of the vortex may be any desired direction and the number of turns may be any desired number. The number of curved parts, the number of bending parts, and the number of straight parts in the terminators according to the aforementioned embodiments may be any desired number.

The present invention has been described above with reference to the exemplary embodiments, but the present invention is not limited to the above exemplary embodiments. The configuration and details of the present invention can be modified in various ways which can be understood by those skilled in the art within the scope of the invention.

This application is based upon and claims the benefit of priority from Japanese patent application No. 2014-172733, filed on Aug. 27, 2014, the disclosure of which is incorporated herein in its entirety by reference.

REFERENCES SIGNS LIST 1-5 TERMINATORS
1A, 2A, 3A, 4A, 5A OUTER ENDS
1B, 2B, 3B, 4B, 5B INNER ENDS
6 SUBSTRATE
7 OPTICAL WAVEGUIDE
7A END
8 SEMICONDUCTOR OPTICAL AMPLIFIER
9 PHOTONICS DEVICE
10 MOUNTING BOARD
30, 40 INTRODUCING OPTICAL WAVEGUIDES
31, 52 STRAIGHT PARTS
32, 51 BENDING PARTS
41, 42 CURVED PARTS
84 END FACE
85 NON-REFLECTIVE COATING
90 SUBSTRATE
91, 92 RING RESONATORS
93 LOOP MIRROR
94 ELECTRODE
96A-96C SILICON WAVEGUIDES
97 END FACE
98 NON-REFLECTIVE COATING
100, 200, 300, 400, 500 OPTICAL DEVICES
600 OPTICAL FUNCTIONAL INTEGRATED UNIT

601 LASER LIGHT
T1-T5 TERMINATORS

The invention claimed is:

1. An optical device comprising:
an optical waveguide through which light propagates, the optical waveguide being formed on a substrate;
a terminator formed on the substrate in such a way that the terminator is connected to one end of the optical waveguide; and
an introducing optical waveguide provided between the terminator and the optical waveguide, wherein
the terminator comprises:
a plurality of curved optical waveguides having such a curvature that it causes a bending loss in an input light input from the optical waveguide, having a center axis in a direction vertical to a principal surface of the substrate and bending in one direction, the input light decaying as it propagates through the plurality of curved optical waveguides; and
a plurality of straight optical waveguides coupling the plurality of curved optical waveguides,
the coupling between the plurality of curved optical waveguides and the plurality of straight optical waveguides produces a concentric and polygonal spiral optical waveguide having the center axis in the direction vertical to the principal surface of the substrate,
the optical waveguide is connected to an end on an outer peripheral side of the spiral optical waveguide, and
the optical waveguide and the introducing optical waveguide are connected to each other in such a way that the connection part between the optical waveguide and the introducing optical waveguide has a curvature smaller than that of each of the curved optical waveguides.

2. The optical device according to claim 1, wherein a curved part included in the introducing optical waveguide has a curvature smaller than that of each of the curved optical waveguides.

3. The optical device according to claim 1, wherein the optical waveguide and the plurality of curved optical waveguides are formed on the same layer on the substrate.

4. The optical device according to claim 1, wherein the optical waveguide and the plurality of curved optical waveguides are made of silicon.

5. A terminator formed on a substrate in such a way that the terminator is connected to one end of an optical waveguide, comprising:
a plurality of curved optical waveguides having such a curvature that it causes a bending loss in an input light input from the optical waveguide, having a center axis in a direction vertical to a principal surface of the substrate and bending in one direction, the input light decaying as it propagates through the plurality of curved optical waveguides; and
a plurality of straight optical waveguides coupling the plurality of curved optical waveguides, wherein
the coupling between the plurality of curved optical waveguides and the plurality of straight optical waveguides produces a concentric and polygonal spiral optical waveguide having the center axis in the direction vertical to the principal surface of the substrate,
the optical waveguide is connected to an end on an outer peripheral side of the spiral optical waveguide,
an introducing optical waveguide is provided between the terminator and the optical waveguide, and
the optical waveguide and the introducing optical waveguide are connected to each other in such a way that the connection part between the optical waveguide and the introducing optical waveguide has a curvature smaller than that of each of the curved optical waveguides.

6. A method for manufacturing an optical device comprising:
forming an optical waveguide through which light propagates on a substrate; forming a terminator on the substrate in such a way that the terminator is connected to one end of the optical waveguide; and
forming an introducing optical waveguide provided between the terminator and the optical waveguide, wherein
the terminator comprises:
a plurality of curved optical waveguides having such a curvature that it causes a bending loss in an input light input from the optical waveguide, having a center axis in a direction vertical to a principal surface of the substrate and bending in one direction, the input light decaying as it propagates through the plurality of curved optical waveguides; and
a plurality of straight optical waveguides coupling the plurality of curved optical waveguides,
the coupling between the plurality of curved optical waveguides and the plurality of straight optical waveguides produces a concentric and polygonal spiral optical waveguide having the center axis in the direction vertical to the principal surface of the substrate,
the optical waveguide is connected to an end on an outer peripheral side of the spiral optical waveguide, and
the optical waveguide and the introducing optical waveguide are connected to each other in such a way that the connection part between the optical waveguide and the introducing optical waveguide has a curvature smaller than that of each of the curved optical waveguides.

* * * * *